INVENTORS
LEON I. MAISSEL
CHARLES L. STANDLEY
BY
Sughrue, Rothwell, Mion, & Zinn
ATTORNEYS United States Patent Office 3,285,836
Patented Nov. 15, 1966

3,285,836
METHOD FOR ANODIZING

Leon I. Maissel and Charles L. Standley, Poughkeepsie, N.Y., assignors to International Business Machines Corporation, New York, N.Y., a corporation of New York Filed June 28, 1963, Ser. No. 291,347
10 Claims. (Cl. 204—15)

Figure 1:
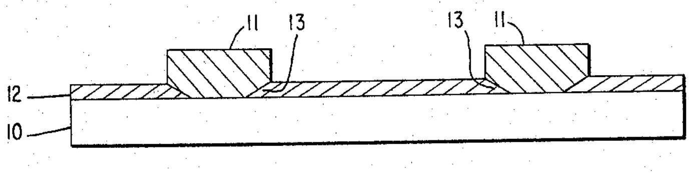
FIG. 1 (PRIOR ART)

The present invention relates to a method for anodizing selected areas of a metal surface. More specifically, this invention is concerned with a method for anodizing metal so that the areas on which metal oxide is formed may be controlled with great precision.

According to conventional anodizing practice, those areas of a metal body on which the formation of an anodized metal oxide film is not desired are ordinarily masked with a suitable resist material, such as electroplater's tape, KMER or the like. For many applications, this technique has been satisfactory, but the method has been found to be unsuited to applications requiring precise control over the dimensions of the unanodized regions.

A major disadvantage encountered is masking according to conventional practice has been the tendency of the anodized film to creep in under the masking material. The metal oxide may creep several mils under conventional resist materials during anodizing and so the unanodized zones formed on the base metal are actually quite a bit smaller in area than the zones initially masked. In the manufacture of anodized foil capacitors, for example, it has been found to be impossible to anodize the metal foil cathode leaving thin unanodized lines having a width of a few mils or less due to creeping of the anodized film under the the resist material.

Therefore, the primary object of the present invention is to provide a method for anodizing selected areas of metal so that the dimensions of the unanodized portions may be precisely controlled.

A further object of the present invention is to provide a method for masking portions of a metal base so that creeping of the anodic film under the resist material is avoided.

Another object of the present invention is to provide a method for producing electrical devices involving the deposition of thin films, such as capacitors, tunnel diodes, insulated gates, etc., comprising anodizing a metal foil so that thin lines on the surface of the foil are left unanodized.

The manner in which the foregoing objects together with many other advantages of the present invention are achieved will be better appreciated in the light of the following detailed description of the invention considered with reference to the accompanying drawing.

In the drawing:

FIG. 1 is a side cross-sectional view of an edge of a metal sheet which has been masked and anodized according to prior art practice, and FIGS. 2*a*, *b* and *c* are side cross-sectional views of an edge of a metal sheet showing the structures produced at successive stages of the present invention.

In general, the present invention comprises masking the metal to be selectively anodized with a layer of another metal, anodizing the surface of the base metal in the areas remaining exposed and also anodizing the layer of masking metal and then removing the anodized oxide of the masking metal and the underlying masking metal.

By anodizing in this manner, it is found that there is no creeping of the base metal oxide film under the layer of masking metal during anodization. The masking metal is chosen so that it and its oxide may be preferentially removed from the surface of the base metal, as by application of a selective etchant, leaving intact the base metal and the oxide film of the base metal.

The importance of the present invention may be more fully realized by considering the prior art practice as illustrated in FIG. 1 of the drawing. According to prior practice, a metal base 10 is masked with a layer of resist material 11 in those regions where the formation of an anodized metal oxide film is not desired.

The base metal 10 may be any metal capable of being anodized, such as tantalum or aluminum foils which may serve as the anodes in thin film capacitors of the rolled or stacked plate variety or as either electrode in a thin film capacitor of the vacuum deposited type. The resist materials 11 frequently used in conventional practice comprise tapes, lacquers, resins and other materials resistant to anodizing baths and capable of blocking the formation of an anodic film on the surface of base metal 10.

The masked base metal is then anodized in any standard anodizing bath to produce an anodized metal oxide film 12 on the exposed areas of the base metal. However, upon removal of the resist material 11, it is found that the metal oxide film 12 has crept under the edge of the resist at 13, the interface between the resist 11 and the anodized film 12. As a result, the unanodized zone on the surface of base metal 10 is actually smaller than area initially covered by the resist.

The penetration of a very thin layer of electrolyte a few mils under conventional masking materials creates a high resistance region that is capable of supporting most of the anodizing voltage. Furthermore, the amount of penetration or creep of the anodized film under the mask increases with increase in the anodizing voltage, since the electric field at 13, the mask-cathode interface, is in excess of $6 \times 10^6$ volts/cm.

Where the width of the area initially masked is relatively narrow, on the order of a few mils, creepage under each side of the mask may completely cover the masked area with metal oxide.

Figure 2:
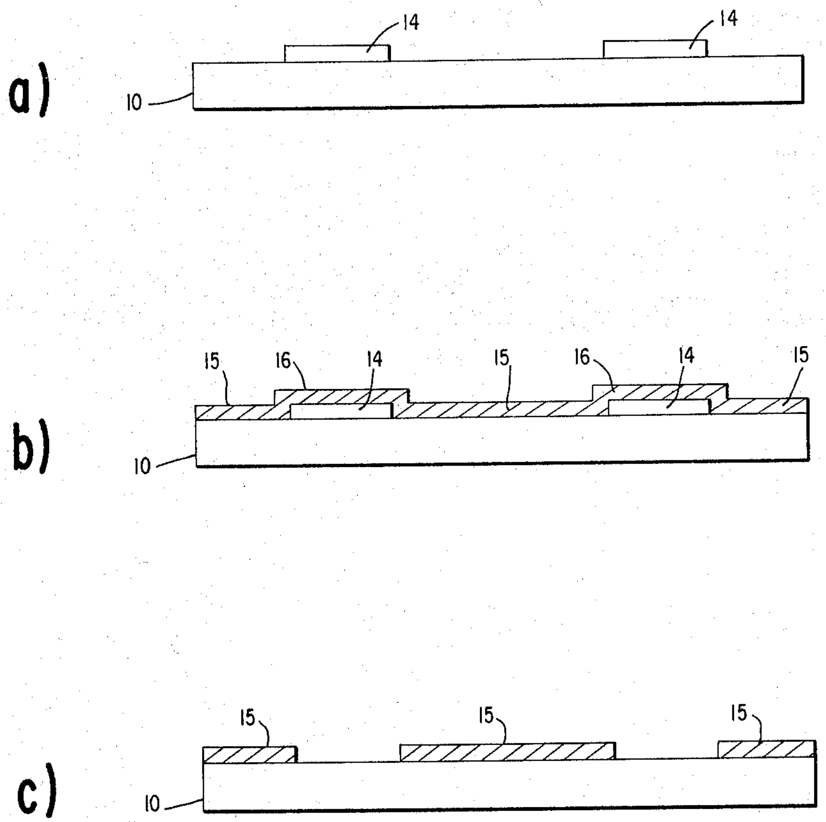

Referring now to FIG. 2 of the drawing, which is a cross-sectional edge view of material produced according to the present invention, the progressive stages of the method may be seen in FIGURES 2*a*, 2*b* and 2*c*.

The first step of the invention comprises masking the base metal 10 with a different metal 14 in the areas where no anodization is desired. Metal 14 preferably is selected so that the metal itself and its oxide formed by anodization may be preferentially removed by the application of a leaching agent or solvent or by electrolytic etching which leaves the base metal and base oxide intact. For example, in FIGURE 2*a*, the base metal 10 may be tantalum and the masking metal 14 may be aluminum.

Any combination of valve metals may be employed as the base metal and masking metal. Examples of these are: tantalum, molybdenum, aluminum, zirconium, hafnium, tungsten, bismuth, antimony, beryllium, magnesium, silicon, germanium, tin, titanium and uranium. The limitation involved in using combinations of these materials is in finding an etchant which will selectively attack the oxide of the masking material and yet leave undisturbed the base material.

The masking metal may be applied by spraying, evaporation decomposition of an organo-metallic compound, such as a metal carbonyl, or other technique. Masks, stencils, patterns or the like may be used to restrict the deposit of the masking metal to those regions of base metal 16 where no anodized film is to be produced. The base and masking metals must both be valve metals, i.e., they must be capable of forming an anodic oxide film.

As illustrated in FIG. 2*b*, the next major step comprises formation of an anodized film over the surfaces of base metal 10 and masking metal 14. As a result of the anodizing step, a base metal oxide 15 is formed on the exposed surface of base metal 10 and a masking metal oxide 16 is formed on the surface of the masking metal 14.

Again assuming for purposes of illustration that base metal 10 is tantalum and masking metal 14 is aluminum, the portions 15 and 16 of the anodized film are tantalum oxide and aluminum oxide respectively.

Next, the material of FIG. 2*b* is contacted with a reagent which is an etchant or solvent for the masking metal 14 and the masking metal oxide 16, but in which the base metal 10 and base metal oxide 15 are substantially insoluble. As seen in FIG. 2*c*, this results in removal of the masking metal 14 and its oxide film 16. The remaining structure comprises the base metal 10 having an anodized base metal oxide film 15 at selected areas and unanodized base metal areas 18 of substantially the same dimensions as were initially covered by masking metal 14. No significant creeping or penetration of the base metal oxide 15 under the masking metal 14 is in evidence after removal of the masking metal and its oxide film by preferential etching.

Thus, for example, where capacitors comprising a tantalum cathode and a tantalum oxide insulation having unanodized regions of precisely controlled dimensions are to be produced, the present method enables unanodized lines 18 only a few mils in width to be formed.

Where tantalum base metal and aluminum masking metal are in fact used, a dilute solution of sodium hydroxide is a satisfactory etchant, since it readily dissolves aluminum and aluminum oxide but does not attack the tantalum and tantalum oxide.

The combination of base and masking metals which may be employed according to the present invention may be extended, if the masking metal and its oxide are removed by electrolytic rather than chemical etching.

In addition to tanttalum and aluminum, other combinations of metals may be employed in accordance with the present invention. For example, where the product to be produced is an aluminum-aluminum oxide foil capacitor, a masking metal of titanium may be employed. The titanium masking metal and its anodized surface film may be preferentially removed by etching with warm 50% surfuric acid.

Other combinations of base metals, masking metals and etchant materials which preferentially dissolve the masking metal and masking metal oxide are as follows:

| Base Metals | Masking Metals | Etchant Solutions |
|---|---|---|
| A. Niobium | Bismuth | Nitric Acid. |
| B. Tungsten | Aluminum | Potassium Hydroxide. |
| C. Zirconium | do | Dilute Ammonium Hydroxide. |
| D. Aluminum | Bismuth | Nitric Acid. |

The following detailed example of a preferred embodiment of the present invention will also be of assistance in gaining a full appreciation of the invention.

*Example 1*

Aluminum was evaporated through a stencil and deposited on the surface of a tantalum foil in the form of spaced stripes or lines having a width of approximately 2 mils and a thickness of approximately 5000 Angstroms.

The tantalum foil masked with aluminum was then anodized to deposit a tantalum oxide and aluminum oxide film on its surface. The composition of the anodizing bath and the conditions under which the anodization step was conducted were as follows:

| | |
|---|---|
| Bath composition | 5% boric acid. 10% sodium tetraborate. |
| Temperature | 25° C. |
| Time | Approximately 1 hour. |
| Anodizing voltage | 60 volts. |
| Current density | 1 ma./cm.$^2$ (until formation voltage reached). |
| Thickness of anodized film | Approximately 15 A volt. |

The anodized foil was then immersed for 2 minutes in a sodium hydroxide solution having a concentration of 10% for approximately 2 minutes to etch the aluminum oxide produced in the anodizing step and also to remove the underlying aluminum stripe.

The resulting unanodized stripes or lines on the surface of the tantalum foil had a width of 2 mils.

*Example 2*

The method of Example 1 was repeated except that the etching was accomplished electrolytically. The masked and anodized foil was immersed in a 10% NaOH solution which had been diluted 10 times +2 volts was applied to the system for from 1 to 2 minutes.

It should be understood that the nature of the anodizing bath is not critical and that any standard bath, such as sodium sulphate, sulfuric acid, phosphoric acid, citric acid, may be used. Also, the formation voltage and current densities utilized in the anodization procedure may vary over wide limits. The formation voltage may be as high as 100 volts and the current density may vary from 1 microampere per centimeter of anode area to from 1 to 2 milliamperes per centimeter.

For use with tantalum base-aluminum masking systems, the sodium hydroxide etching solution may have a concentration of from about 10% to 15%. Other etchants capable of dissolving aluminum and aluminum oxide in preference to tantalum and tantalum oxide include, for example, 10% sodium carbonate and 10% ammonium hydroxide.

It is apparent that although the method has been described for the most part in connection with the manufacture of capacitors, for which it has special utility in enabling very fine unanodized lines to be formed on the anode, many other applications of this procedure will no doubt be obvious to those skilled in the art.

In addition to the production of capacitors, the present invention has general application in the thin film art. For example, the invention has been successfully employed to make tunnel emission diodes and insulated gates for three-terminal devices for thin film transistors.

What is claimed is:

1. A method for anodizing selected areas of the metal surface of a valve metal leaving other areas of the surface unanodized and precisely controlling the dimensions of the unanodized area comprising, depositing a layer of masking metal on selected portions of the surface of a base metal, said masking metal and said base metal being different metals and said masking metal being a valve metal, anodizing both the surface of said base metal where exposed and the surface of said layer of masking metal to deposit a film of base metal oxide on said base metal where exposed and a film of masking metal oxide on said layer of masking metal, and selectively removing said masking metal and said film of masking metal oxide from the surface of said base metal to expose unanodized areas on the surface of said base metal, said unanodized areas having dimensions corresponding to the dimensions of said layer of masking metal.

2. The method of claim 1 wherein said base metal is tantalum and said masking metal is aluminum.

3. The method of claim 1 wherein said base metal is aluminum.

4. A method for anodizing selected areas of the surface of a valve metal leaving other areas of the surface unanodized and precisely controlling the dimensions of the unanodized area comprising, depositing a layer of masking metal on selected portions of the surface of a base metal, said masking metal and said base metal being different metals and said masking metal being a valve metal, anodizing both the surface of said base metal where exposed and the surface of said layer of masking metal to deposit a film of base metal oxide on said base metal where exposed and a film of masking metal oxide on said layer of masking metal, and preferentially etching said masking metal and said film of masking metal oxide from the surface of said base metal to expose unanodized areas on the surface of said base metal, said unanodized areas having dimensions corresponding to the dimensions of said layer of masking metal.

5. The method of claim 4 wherein said base metal is tantalum and said masking metal is aluminum.

6. The method of claim 4 wherein said base metal is aluminum.

7. The method of claim 4 wherein said layer of masking metal is deposited by evaporation and condensation onto said base metal.

8. The method of claim 4 wherein said preferential etching is accomplished chemically.

9. The method of claim 4 wherein said preferential etching is accomplished electrolytically.

10. A method for anodizing a selected area of a tantalum metal surface leaving another area of the said tantalum metal surface unanodized and precisely controlling the dimensions of the unanodized area comprising, depositing a layer of aluminum masking metal on selected portions of a tantalum base metal, anodizing both the surface of said tantalum where exposed and the surface of said aluminum to deposit a film of tantalum oxide on said tantalum and a film of aluminum oxide on said aluminum, and preferentially etching said aluminum oxide and said aluminum from the surface of said tantalum by contact with a dilute aqueous solution of sodium hydroxide to expose unanodized areas on the surface of said tantalum, said unanodized areas having dimensions corresponding to the dimensions of said layer of aluminum masking metal.

References Cited by the Examiner

UNITED STATES PATENTS

| | | | |
|---|---|---|---|
| 2,993,847 | 7/1961 | Poch | 204—18 |
| 3,035,990 | 5/1962 | Davis et al. | 204—33 |
| 3,037,896 | 6/1962 | Gauntt | 204—33 |

JOHN H. MACK, *Primary Examiner.*

T. TUFARIELLO, *Assistant Examiner.*